United States Patent
Cheng et al.

(10) Patent No.: US 9,087,905 B2
(45) Date of Patent: Jul. 21, 2015

(54) TRANSISTOR FORMATION USING COLD WELDING

(71) Applicant: INTERNATIONAL BUSINESS MACHINES CORPORATION, Armonk, NY (US)

(72) Inventors: Cheng-Wei Cheng, White Plains, NY (US); Shu-Jen Han, Cortlandt, NY (US); Masaharu Kobayashi, Yorktown Heights, NY (US); Ko-Tao Lee, Kaohsiung (TW); Devendra K. Sadana, Pleasantville, NY (US); Kuen-Ting Shiu, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/633,973

(22) Filed: Oct. 3, 2012

(65) Prior Publication Data
US 2014/0094006 A1    Apr. 3, 2014

(51) Int. Cl.
*H01L 21/30* (2006.01)
*H01L 29/786* (2006.01)
(Continued)

(52) U.S. Cl.
CPC ...... *H01L 29/78603* (2013.01); *H01L 21/6835* (2013.01); *H01L 24/08* (2013.01); *H01L 24/80* (2013.01); *H01L 24/92* (2013.01); *H01L 29/78681* (2013.01); *H01L 24/03* (2013.01); *H01L 24/05* (2013.01); *H01L 2221/68363* (2013.01); *H01L 2221/68377* (2013.01); *H01L 2221/68381* (2013.01); *H01L 2224/0345* (2013.01); *H01L 2224/0361* (2013.01); *H01L 2224/03452* (2013.01); *H01L 2224/03914* (2013.01); *H01L 2224/05617* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/08145* (2013.01); *H01L 2224/08225* (2013.01);
(Continued)

(58) Field of Classification Search
CPC ............... H01L 21/2007; H01L 21/76251; H01L 33/0079; H01L 2224/06517
USPC .......... 438/455, 459, 183, 197; 257/E21.217, 257/E21.051
See application file for complete search history.

(56) References Cited

U.S. PATENT DOCUMENTS 2,522,408 A * 9/1950 Sowter .......................... 228/116
4,883,561 A   11/1989 Gmitter et al.
(Continued)

OTHER PUBLICATIONS

Kim et al., "Nanolithography based on patterned metal transfer and its application to organic electronic devices," Appl. Phys. Lett. 80, 2002, pp. 4051-4053.*

(Continued)

*Primary Examiner* — Julia Slutsker
(74) *Attorney, Agent, or Firm* — Tutunjian & Bitetto, P.C.; Louis J Percello (57) ABSTRACT

A device and method for fabrication includes providing a first substrate assembly including a first substrate and a first metal layer formed on the first substrate and a second substrate assembly including a second substrate and a second metal layer formed on the second substrate. The first metal layer is joined to the second metal layer using a cold welding process wherein one of the first substrate and the second substrate includes a semiconductor channel layer for forming a transistor device.

24 Claims, 7 Drawing Sheets

(51) Int. Cl.
*H01L 21/683* (2006.01)
*H01L 23/00* (2006.01)

(52) U.S. Cl.
CPC .............. *H01L 2224/08245* (2013.01); *H01L 2224/80006* (2013.01); *H01L 2224/8083* (2013.01); *H01L 2224/80201* (2013.01); *H01L 2224/80203* (2013.01); *H01L 2224/80801* (2013.01); *H01L 2224/9202* (2013.01); *H01L 2924/1306* (2013.01); *H01L 2924/13091* (2013.01)

(56) References Cited

U.S. PATENT DOCUMENTS

| | | | |
|---|---|---|---|
| 5,728,623 | A | 3/1998 | Mori |
| 6,323,108 | B1 | 11/2001 | Kub et al. |
| 6,455,398 | B1 | 9/2002 | Fonstad, Jr. et al. |
| 6,891,234 | B1* | 5/2005 | Connelly et al. ............... 257/407 |
| 6,962,835 | B2 | 11/2005 | Tong et al. |
| 7,064,391 | B1* | 6/2006 | Conn ............................ 257/351 |
| 7,897,446 | B2 | 3/2011 | Smorchkova et al. |
| 8,664,699 | B2* | 3/2014 | Nuzzo et al. ................... 257/213 |
| 2005/0067716 | A1 | 3/2005 | Mishra et al. |
| 2005/0095878 | A1 | 5/2005 | Palanisamy |
| 2005/0133866 | A1* | 6/2005 | Chau et al. .................... 257/348 |
| 2006/0052947 | A1 | 3/2006 | Hu |
| 2007/0001243 | A1* | 1/2007 | Kizilyalli et al. .............. 257/411 |
| 2008/0113463 | A1 | 5/2008 | Liu et al. |
| 2009/0294803 | A1* | 12/2009 | Nuzzo et al. ................... 257/213 |
| 2010/0258841 | A1 | 10/2010 | Lidow et al. |
| 2012/0288083 | A1 | 11/2012 | Sun et al. |
| 2012/0309145 | A1 | 12/2012 | Song et al. |
| 2013/0001731 | A1* | 1/2013 | Forrest et al. ................. 257/443 |
| 2013/0037095 | A1* | 2/2013 | Forrest et al. ................. 136/256 |
| 2013/0089968 | A1 | 4/2013 | Usenko |

OTHER PUBLICATIONS

Ferguson et al., "Contact Adhesion of Thin Gold Films on Elastomeric Supports: Cold Welding Under Ambient Conditions," Science, New Series, vol. 253, 1991, pp. 776-778.*

Cao, Y., et al. "Effects of Dust Particles and Layer Properties on Organic Electronic Devices Fabricated by Stamping" Journal of Applied Physics, vol. 98, Issue 3. Aug. 2005. pp. 1-6.

Chen, T.D., et al. "Epilayer Transfer for Integration of III-V Photodetectors Onto a Silicon Platform Using Au—Sn and Pd—Ge Bonding" 2000 International Conference on Indium Phosphide and Related Materials. May 2000. pp. 502-505.

Gosele, U., et al. "Semiconductor Wafer Bonding" Annual Review of Materials Science, vol. 28. Aug. 1998. pp. 215-241.

Yablonovitch, E., et al. "Extreme Selectivity in the Lift-Off of Epitaxial GAAS Films" Applied Physics Letters, vol. 51, No. 26. Dec. 1987. pp. 2222-2224.

Non-Final Office Action issued in U.S. Appl. No. 13/660,497 on May 14, 2013. (18 Pages).

Final Office Action issued in U.S. Appl. No. 13/660,497 on Sep. 5, 2013. (20 Pages).

Kim, C., et al. "Micropatterning of Organic Electronic Devices by Cold-Welding" Science. vol. 288 No. 5467. May 2000. (4 Pages).

Kim, C., et al. "Nanolithography Based on Patterned Metal Transfer and Its Application to Organic Electronic Devices" Applied Physics Letters. vol. 80. No. 4051. May 2002. (4 Pages).

Office Action mailed on Apr. 16, 2014 for U.S. Appl. No. 13/660,497.

* cited by examiner

TRANSISTOR FORMATION USING COLD WELDING

BACKGROUND

1. Technical Field

The present invention relates to semiconductor device fabrication, and more particularly to devices and methods, which employ cold welding.

2. Description of the Related Art

Semiconductor processes are typically performed in vacuum chambers under high temperature conditions. Creating and maintaining low pressure and high temperature environments is expensive. It would be desirable to reduce the number of processes that need to be performed in such environments to preserve thermal budget and reduce costs of semiconductor processing and its resultant devices.

SUMMARY

A method for fabrication of a semiconductor device includes providing a first substrate assembly including a first substrate and a first metal layer formed on the first substrate and a second substrate assembly including a second substrate and a second metal layer formed on the second substrate. The first metal layer is joined to the second metal layer using a cold welding process wherein one of the first substrate and the second substrate includes a semiconductor channel layer for forming a transistor device.

Another method for fabrication of a semiconductor device includes forming a sacrificial layer over a first substrate; forming a channel layer on the sacrificial layer; forming a dielectric layer on the channel layer; forming a first metal layer on the dielectric layer; cold-welding the first metal layer to a second metal layer formed on a second substrate; etching the sacrificial layer to expose the channel layer and remove the first substrate; and forming a transistor device using the channel layer.

Yet another method for fabrication of a semiconductor device includes forming a channel layer over a first substrate; forming a dielectric layer on the channel layer; forming a first metal layer on the dielectric layer; cold-welding the first metal layer to a second metal layer formed on a second substrate; etching the first substrate to expose the channel layer and remove the first substrate; and forming a transistor device using the channel layer.

A semiconductor device includes a first semiconductor substrate having a first metal layer formed on a major surface of the first semiconductor substrate, and a second substrate having a second metal layer formed on a major surface of the second substrate. A cold weld interface couples the second metal layer to the first metal layer.

Another semiconductor device includes a substrate, a first metal layer formed over the substrate, and a cold weld coupling a second metal layer to the first metal layer. A dielectric layer is provided on which the second metal layer is formed. A monocrystalline channel layer is provided on which the dielectric layer is formed, the channel layer including source and drain regions therein. A gate structure is formed over the channel layer.

Yet another semiconductor device includes a silicon substrate, a first metal layer formed over the substrate and a cold weld coupling a second metal layer to the first metal layer. A dielectric layer is provided on which the second metal layer is formed, and a monocrystalline III-V semiconductor channel layer is provided on which the dielectric layer is formed, the channel layer including source and drain regions therein. A gate structure is formed over the channel layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, devices and methods are provided in which a semiconductor structure is fabricated using a cold weld process to create an interface between components or layers of the structure. In one embodiment, a first substrate includes a metal layer and a second substrate includes a metal layer. Either substrate may include other components and may have been subjected to other semiconductor processing steps. In one embodiment, the metal layers of the two substrates are brought into contact and cold welded to each other. The cold weld interface may be employed as part of a wafer transfer process or may be employed to attach components at different locations on a final device. The cold weld process preferably is performed at room temperature and at atmospheric pressure. The cold weld process may be performed in a clean room environment, but low pressure (vacuum) and high temperatures are not needed.

It is to be understood that the present invention will be described in terms of a given illustrative architecture having substrates and layers or stacks of layers; however, other architectures, structures, substrates, materials, process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a semiconductor device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit devices or chips. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the device/chip are then integrated with other chips, discrete circuit elements, and/or other signal processing devices as part of either (a) an intermediate product, such as a motherboard, or (b) an end product. The end product can be any product that includes integrated circuit chips, ranging from toys, solar devices and other applications including computer products or devices having a display, a keyboard or other input device, and a central processor.

It should also be understood that material compounds will be described in terms of listed elements, e.g., GaInP, InGaAs or SiGe. These compounds include different proportions of the elements within the compound, e.g., InGaAs includes $In_x$, $Ga_yAs_{1-x-y}$, where x, y are less than or equal to 1, or SiGe includes $Si_xGe_{1-x}$ where x is less than or equal to 1, etc. In addition, other elements may be included in the compound, such as, e.g., AlInGaAs, and still function in accordance with the present principles. The compounds with additional elements will be referred to herein as alloys.

Figure 1:
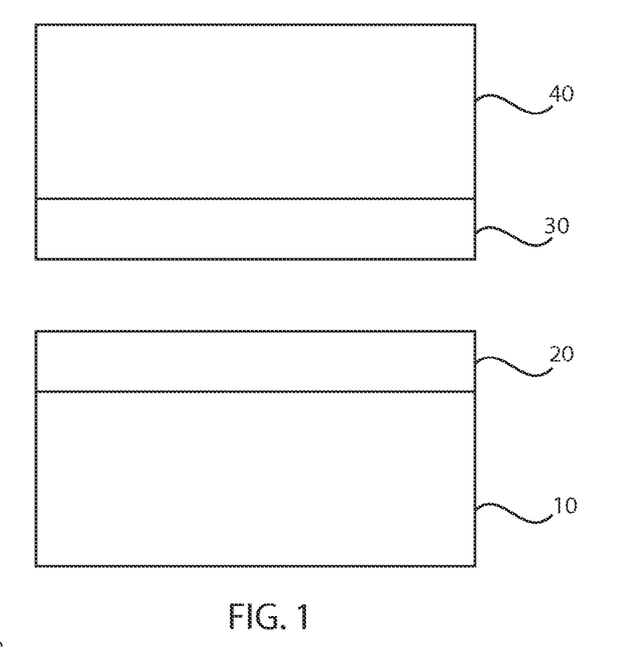
FIG. 1 is a cross-sectional view of a two semiconductor substrates having metal layers to be joined by cold welding in accordance with the present principles.

Referring now to the drawings in which like numerals represent the same or similar elements and initially to FIG. 1, a first substrate 10 includes a metal layer 20 and a second substrate 40 includes a metal layer 30. While the metal layers 20 and 30 are depicted across the entire surface of their respective substrates 10 and 40, the metal layers may be patterned or otherwise modified or textured (e.g., 3D structures) in accordance with an application. It should also be noted the substrates 10, 40 may include multiple layers or components that are the result of earlier processing steps.

The substrates 10, 40 may include monocrystalline materials, such as Si, Ge, SiGe, GaAs, InP and alloys thereof. The metal layers 20, 30 may include any ductile metal, but preferably include a high conductivity metal, such as gold, silver, copper, palladium, combinations of these and other metals or alloys. The surfaces of the metal layers 20 and 30 may be prepared by cleaning, etching or other processing, if needed. Otherwise, the as-formed surfaces may be sufficient to enable cold welding to occur.

Figure 2:
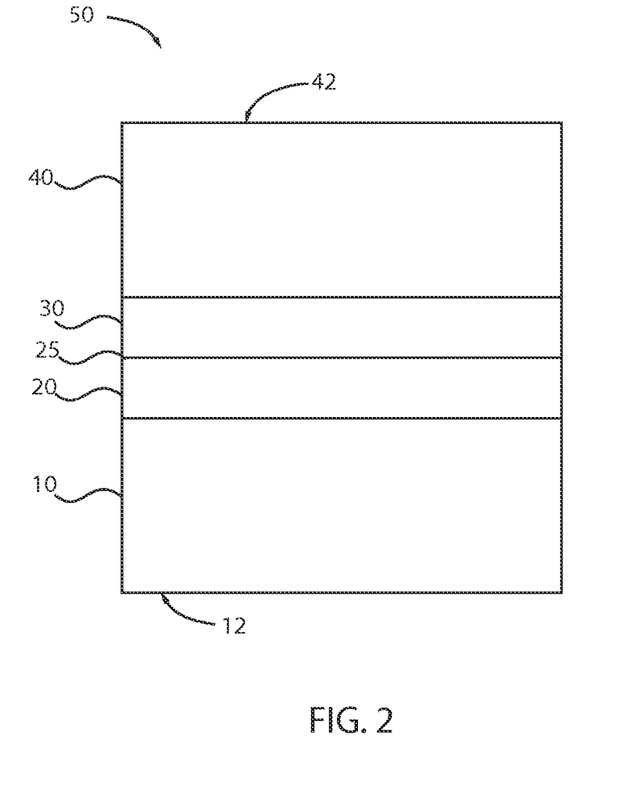
FIG. 2 is a cross-sectional view of the two semiconductor substrates of FIG. 1 after being joined by cold welding in accordance with the present principles.

Referring to FIG. 2, the metal layers 20 and 30 are brought into contact and cold welded together. The cold welding process is preferably performed at or about room temperature in atmospheric pressure conditions. The cold weld process may be performed in a clean room environment, but low pressure (vacuum) and high temperatures are not needed.

The substrates 10, 40 may be held is standard wafer or chip handling jigs, and are brought in contact along surfaces or portions of surfaces of the metal layers 20, 30 in such a way that sufficient pressure is obtained to cause a cold weld interface 25. The cold weld interface 25 includes the same or about the same properties of the bulk metal material of layers 20 and 30. These properties include conductivity and shear and tensile strength. The metal layers 20 and 30 may be the same material, but need not be as different ductile metals may be cold welded under the appropriate conditions (e.g., heat and pressure). The cold weld process needs to be adapted such that the heat and pressure generated during the cold weld process can be supported by the substrates 10 and 40 and intervening layers. Either substrate 10 and/or 40 may include other components and may have been subjected to other semiconductor processing steps. This should be accounted for as well in determining the conditions for the cold weld process.

The cold weld interface 25 may be part of a transfer process (to transfer layers to one of the substrates) or may be employed to combine layers to form a final device. For example, substrates 10 and 40 may include functioning components on surfaces 12 and 42, respectively. The backs (metal layers 20 and 30) of the substrates 10 and 40 may be joined using the cold weld interface 25. The metal layers 20 and 30 may be employed as a heat sink and/or to provide a ground plane for the two substrates 10, 40. Other applications are also contemplated.

In one embodiment, a multi-tiered semiconductor device 50 may be formed by employing cold welding as a bonding method. The substrate 10 with the metal layer 20 formed on a major surface of the substrate 10 may be joined to the substrate 40 having the metal layer 30 formed on a major surface of the substrate 40 using the cold weld interface 25. One or both of the substrates 10, 40 may have semiconductor devices, e.g., transistors, memory cells, logic gates, etc., formed thereon. These can be formed on surfaces 12 and 42 or adjacent to or below metal layers 20, 30. If the metal layers 20, 30 are textured, the devices may be formed between metal structures, for example.

In other embodiments, one of the substrates 10, 40 may be removed by etching or by removing a sacrificial layer to which the substrate is attached, as will be described herein. In this way, a device stack with a cold weld interface may be formed, or a plurality of cold welds may be concurrently formed across the substrate in different areas (at contact points).

Figure 3:
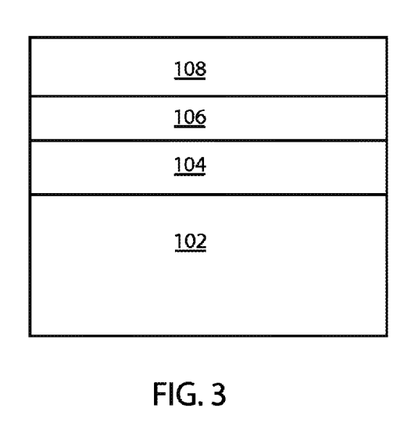
FIG. 3 is a cross-sectional view of a semiconductor substrate having a channel layer formed thereon in accordance with the present principles.

Referring to FIG. 3, in one embodiment, a stack of layers includes a substrate 102, a protection layer 104, a sacrificial layer 106 and a channel layer 108. The channel layer 108 will eventually become a transistor channel layer for a field effect transistor device or other component. The channel layer 108 preferably includes a semiconductor layer such as, e.g., GaAs, InGaAs, or any other suitable material. The channel layer 108 may be by subjected to ion implantation to implant dopants to form source and drain regions (126, FIGS. 9 and 10) within the channel layer 108. The channel layer 108 is preferably a monocrystalline semiconductor which is formed on the sacrificial layer 106. The sacrificial layer 106 will eventually be removed to transfer the channel layer 108 to another substrate as will be described. In this embodiment, the sacrificial layer may include, e.g., AlAs, and the channel layer 108 may be formed on the sacrificial layer 106. Likewise, the protection layer 104 may include InGaAs or other material that is epitaxially grown with the sacrificial layer 106 and the substrate 102. The substrate may include, e.g., InP. Other materials may be employed as well. In another embodiment, wafer bonding may be employed to form the stack of layers in FIG. 3. For example, the monocrystalline channel layer 108 may be formed on a sacrificial layer that is bonded to underlying layers to form the stack. In this way, lattice matching is not needed across the bond interface. This approach permits greater flexibility in material selection. When a monocrystalline structure is needed, layers are preferably epitaxially grown to maintain the crystal structure and lattice matching, if desired.

Figure 4:
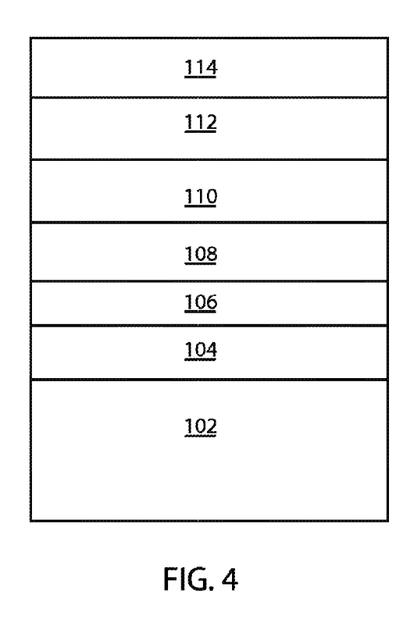
FIG. 4 is a cross-sectional view of the semiconductor substrate of FIG. 3 having additional layers formed thereon including a dielectric layer a diffusion layer and a first metal layer in accordance with the present principles.

Referring to FIG. 4, additional layers may be formed on the stack of layers. The additional layers may include a dielectric layer 110, which is formed in contact with the channel layer 108. The dielectric layer 110 is employed for electronic isolation of the channel layer 108 in the final transistor device to be formed. The dielectric layer 110 may include silicon oxide, silicon nitride, high dielectric constant materials or any other dielectric material. A diffusion barrier 112 is formed on the dielectric layer 110. The dielectric layer 110 and the diffusion barrier 112 may be combined, and one or more of these layers may be eliminated. The diffusion barrier 112 may include TiN or other suitable diffusion barrier material.

A cold-weldable metal layer 114 is formed on the diffusion barrier 112. The metal layer 114 may include Au, Ag, Cu, Pd or other metals, combinations of metals and/or alloys of these and other metals.

Figure 5:
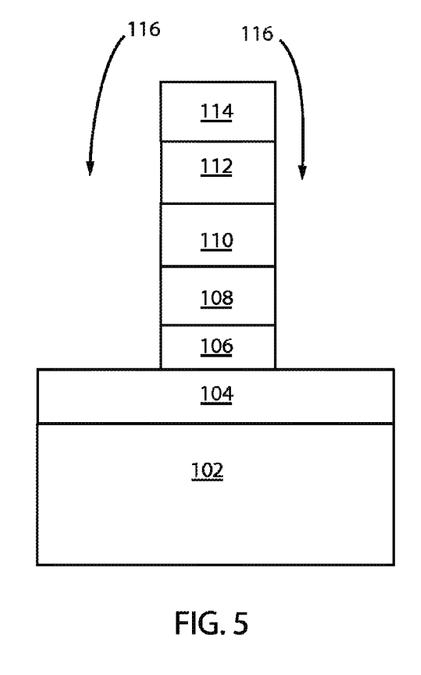
FIG. 5 is a cross-sectional view of the semiconductor substrate of FIG. 4 having the layers patterned in accordance with the present principles.

Referring to FIG. 5, the stack of layers may be lithographically masked and etched to form the stack into needed dimensions to accommodate and appropriately interface with a corresponding layer or stack of layers as will be further described. The lithography may include known lithographic processing using resist and lithographic masks to pattern the resist. The resist (not shown) is then employed to pattern the underlying layers to achieve the desired dimensions of the stack. In the present embodiment, recesses 116 are formed down to the protection layer 104. This forms a first stack assembly 140.

Figure 6:
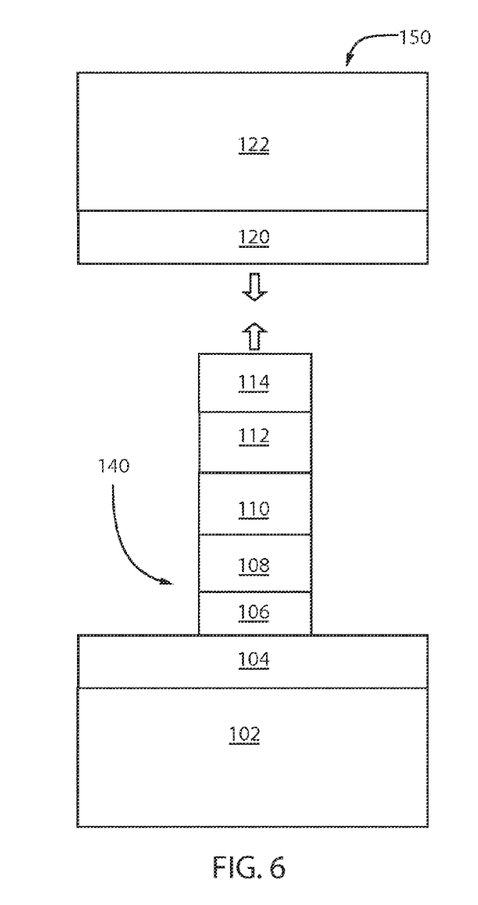
FIG. 6 is a cross-sectional view of the semiconductor substrate of FIG. 5 being moved to contact the first metal layer with a second metal layer on a second substrate in accordance with the present principles.

Referring to FIG. 6, a second stack assembly 150 includes a substrate 122 with a cold-weldable metal layer 120 formed thereon. The substrate 122 may include a monocrystalline silicon substrate although other substrate materials, such as, sheets or flexible substrates, e.g., polyimide films which remain stable in a wide range of temperatures (e.g., KAPTON™), metallic substrates (e.g., KOVAR®, which includes a nickel-cobalt ferrous alloy designed to be compatible with the thermal expansion characteristics of borosilicate glass) or other suitable substrate materials may be employed. The metal layer 120 may be deposited using known deposition processes, e.g., chemical vapor deposition (CVD), sputtering, thermal evaporation, etc. In addition, the metal layer 120 may be patterned or otherwise processed to form physical features, which may be compatible with the metal layer of the first stack assembly 140. The metal layer 120 may include Au, Ag, Cu, Pd or other metals, combinations of metals and/or alloys of these and other metals. The metal layer 120 preferably includes a same metal as metal layer 114, although different metals may also be employed.

The first stack assembly 140 and the second stack assembly 150 are brought into contact to cold weld the metal layer 114 to the metal layer 120. Cold or contact welding is a solid-state welding process in which joining takes place without fusion/heating at the interface of the two parts to be welded. Unlike in the fusion-welding processes, no liquid or molten phase is present in the joint. Cold welding may optionally be performed in a vacuum environment but can be performed at atmospheric pressure conditions. The temperature at which cold welding may be from between about 15 degrees C. to about 250 degrees C., but is preferably performed at room temperature. These conditions provide for a reduction in costs, set up times, etc.

Figure 7:
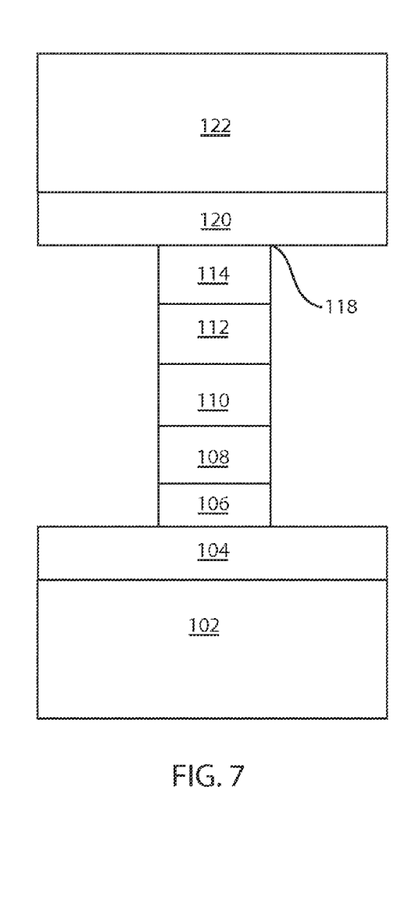
FIG. 7 is a cross-sectional view of the substrates of FIG. 6 after cold welding the first metal layer to the a second metal layer in accordance with the present principles.

Referring to FIG. 7, pressure is applied on one or more or the first stack assembly 140 and the second stack assembly 150 to provide pressure at an interface and to form a cold weld 118. For cold welding, the metal type, the size of the weld, the size and density of dust particles on the contact surface or the flatness of contact surface areas and an applied pressure are employed to determine a duration for applying the pressure. Pressures of between about 1 Pa to about $10^9$ Pa may be provided for between about 50 milliseconds to about 300 seconds. Other pressures and durations are also contemplated. Once cold welded, metal layer 114 may be considered the same metal layer as metal layer 120 as the mechanical and electrical properties are comparable to the raw materials of the bulk metal layers 114 and 120.

It should be noted that the cold welded structure shown in FIG. 7 may be employed as a finished product in some embodiments. For example, substrate 122 may be permanently attached to the layers associated with substrate 102. This structure may be useful to add components locally on a device, e.g., add a MOSFET (channel layer 108) in a memory array (formed on substrate 122). In such an arrangement, the cold weld interface 118 and adjacent metal layers 114, 120 may perform a heat sink function, a ground plane function, etc.

Figure 8:
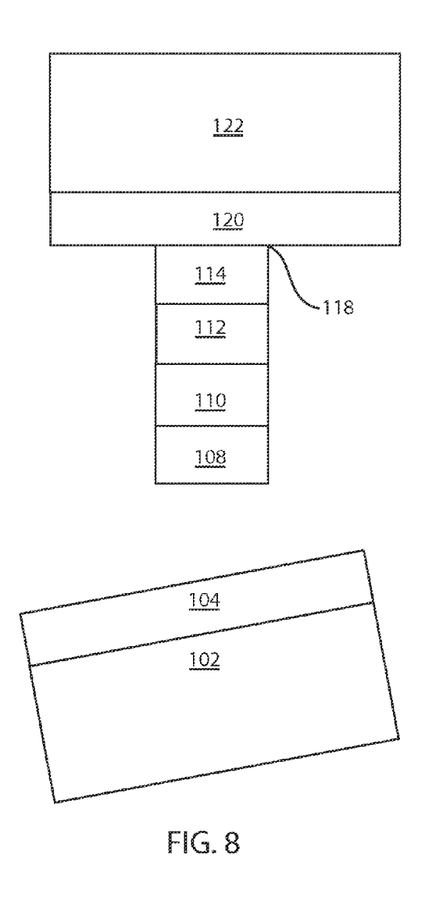
FIG. 8 is a cross-sectional view showing the second substrate being released by removing a sacrificial layer in accordance with the present principles.

Referring to FIG. 8, an etching process etches away the sacrificial layer 106. This releases the substrate 102 and the protection layer 104 from the channel layer 108. The substrate 102 is intact and can therefore be re-used as before. The sacrificial layer 106 may be selectively wet etched to remove the substrate 102 and protection layer 104.

Figure 9:
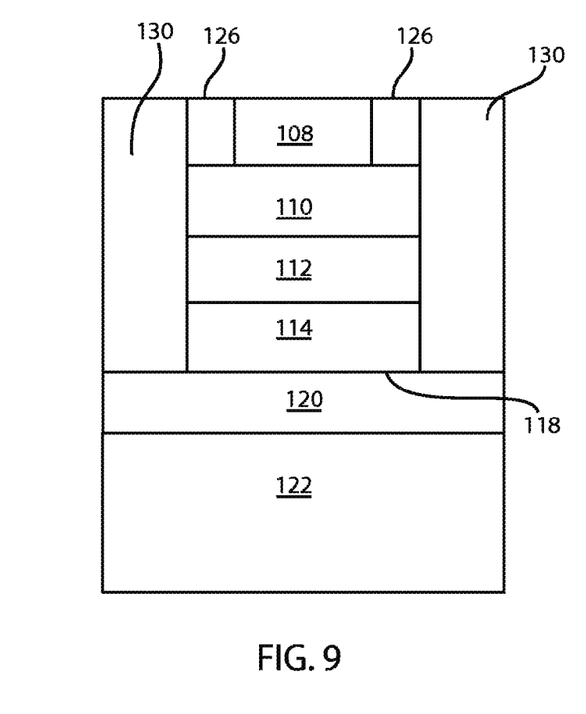
FIG. 9 is a cross-sectional view showing the second substrate of FIG. 8 flipped over and forming a dielectric isolation material in recesses in accordance with the present principles.

Referring to FIG. 9, a dielectric material is deposited to fill-in recesses 116. A deposition process includes, e.g., forming a field oxide or other dielectric in the recesses 116 by a plasma enhanced CVD (PECVD) process at 200 degrees C. The field oxide is preferably planarized to form a dielectric isolation region 130 about layers 108, 110 and 112. The planarization process may include a chemical mechanical polish (CMP) process to level a top of the region 130 with the channel layer 108. The channel layer 108 includes source and drain regions 126. Region 130 functions as a shallow trench isolation (STI) region to prevent charge leakage between devices.

Figure 10:
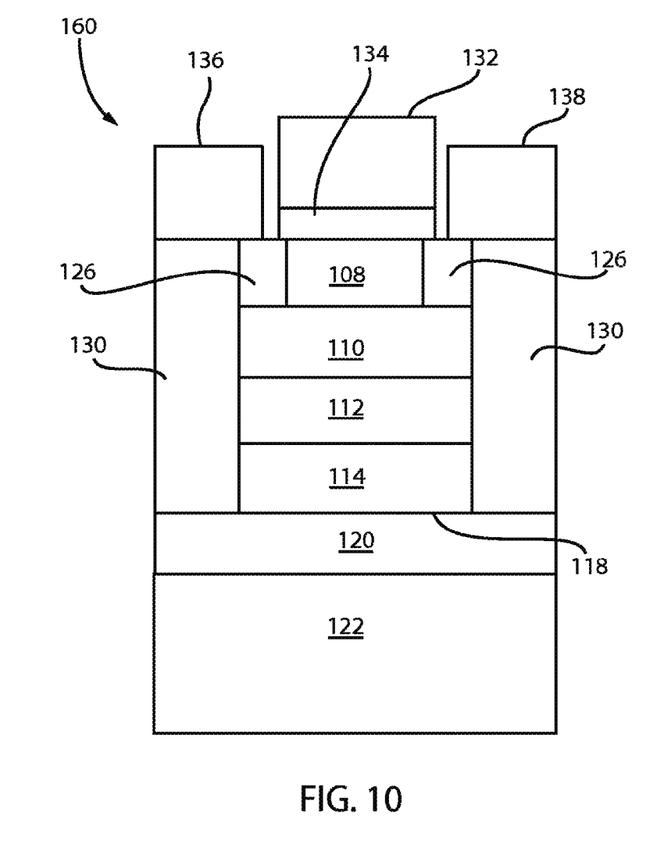
FIG. 10 is a cross-sectional view showing the second substrate of FIG. 9 being formed into a transistor in accordance with one embodiment.

Referring to FIG. 10, a gate conductor 132 is formed over a gate dielectric 134, which is positioned over the channel layer 108 by employing lithographic processing. In one embodiment, the gate conductor 132 may include, e.g., TiN, although other conductive materials may be employed. The gate dielectric 134 may include a high dielectric constant material such as hafnium oxide, although other materials may be employed. Source and drain contacts 138 are deposited and lithographically processed to contact source and drain regions 126 without contacting the gate conductor 132. The contacts 138 may include nickel, germanium, gold or other suitable conductive materials.

A metal oxide semiconductor field effect transistor (MOSFET) 160 may be further processed by providing metal connections to the contacts 138. Additional processing is performed as is known in the art to complete the III-V MOSFET 160, and other structures are formed on the substrate 122. The cold weld 118 and surrounding metal layers 114 and 120 may provide a ground plane or heat sink to improve operation of the MOSFET 160. For example, the conductive material at or near the channel layer 108 further mitigates short channel effects in the MOSFET 160 by providing ground potential at or near a transition body of the MOSFET 160.

Figure 11:
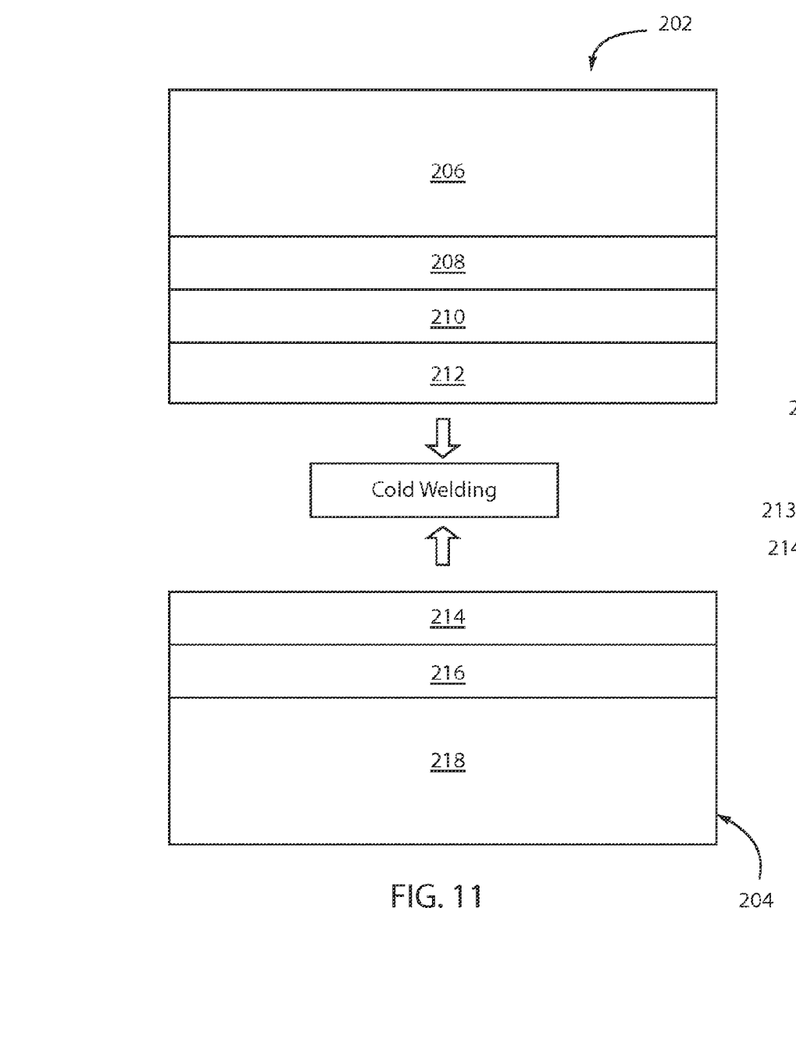
FIG. 11 is a cross-sectional view of semiconductor substrates being moved to contact a first metal layer with a second metal layer on the respective substrates in accordance with another embodiment.

Referring to FIG. 11, another embodiment shows a specific example of cold welding tested by the inventors. A first substrate assembly 202 includes a substrate 206 having a thickness of about 500 microns and may include p-doped InP with a dopant concentration of about $3 \times 10^{18}/cm^3$. A channel layer 208 is formed on the substrate 206 to a thickness of about 30 nm and may include p-doped InGaAs. In this example, the composition of the InGaAs layer 208 includes p-$In_{0.53}Ga_{0.47}As$ and has a dopant concentration of $1 \times 10^{17}/cm^3$. A dielectric layer 210 may include $Al_2O_3$ and is formed on the InGaAs layer 208 to a thickness of about 20 nm. A metal layer 212 is formed on the dielectric layer 210 and may include palladium/gold (Pd/Au). The metal layer 212 may include a thickness of between about 100 Angstroms to about 500 Angstroms.

A second substrate assembly 204 includes a substrate 206 that may include a silicon substrate 218. A dielectric layer 216 may include $Al_2O_3$ and is formed on the substrate 218 to a thickness of about 20 nm. A metal layer 214 is formed on the dielectric layer 216 and may include Pd/Au. The metal layer 212 may include a thickness of between about 100 Angstroms to about 500 Angstroms.

The metal layers 212 and 214 are brought into contact and cold welded by applying a pressure of about 1000 psi between the metal layers 212 and 214. The metal layers 212 and 214 are cold welded resulting in a combined metal layer 213 in FIG. 12.

Figure 12:
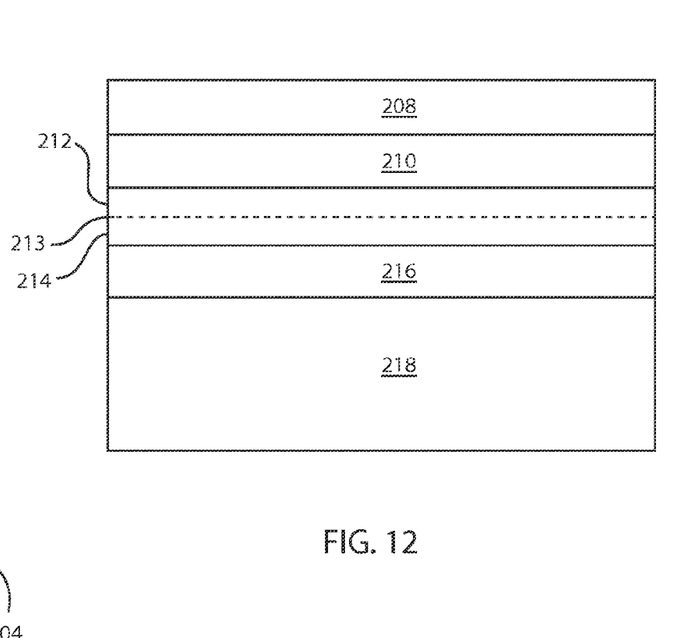
FIG. 12 is a cross-sectional view of the substrates of FIG. 11 after cold welding the first metal layer to the second metal layer and removing one substrate by etching in accordance with the present principles.

Referring to FIG. 12, instead of using a reusable substrate, in this embodiment, the substrate 206 is removed by selective etching, e.g., wet etching. This leaves the channel layer 208 exposed. A device 220 may be further processed to form a field effect transistor or other semiconductor device or component. It should be understood that the aspects of the various described embodiments may be combined as needed. For example, the embodiments of FIGS. 11 and 12 may have lithographically patterned layers, may include semiconductor components on the remaining substrate that were formed by other methods, etc.

Figure 13:
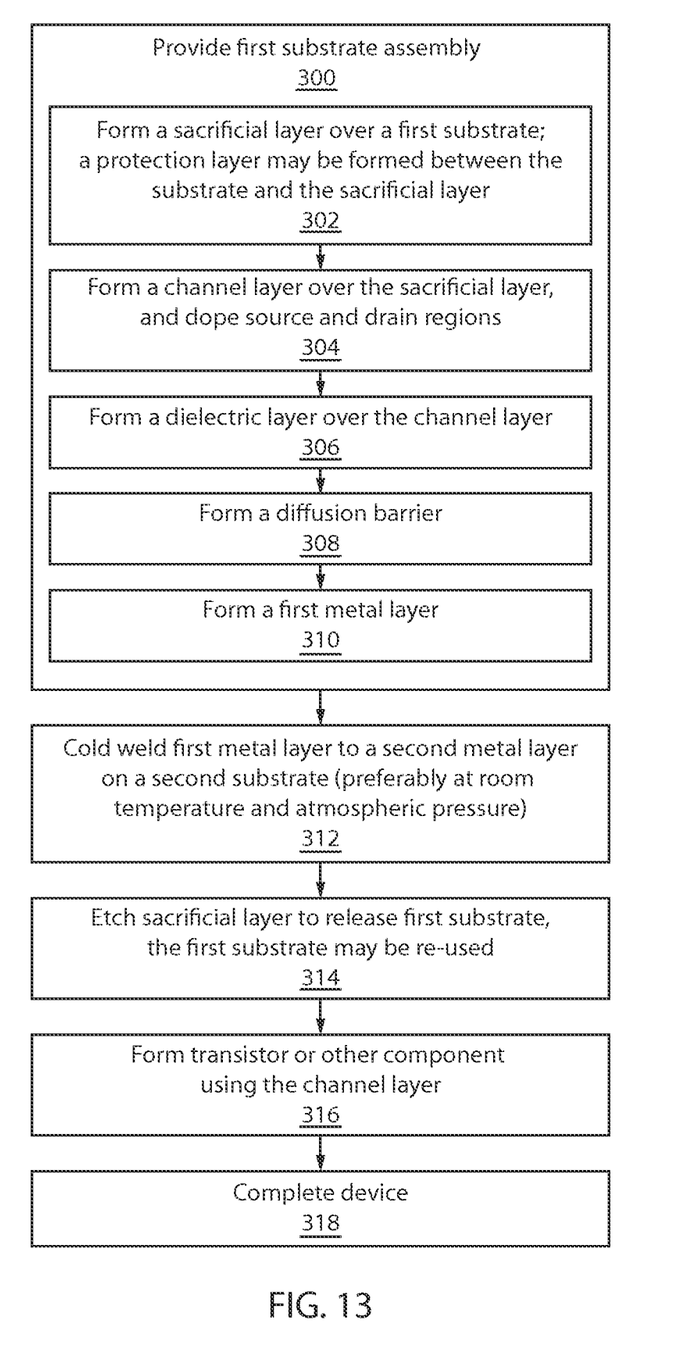
FIG. 13 is a block/flow diagram showing a method for cold welding and removing a substrate by employing a sacrificial layer in accordance with one illustrative embodiment.
Figure 14:
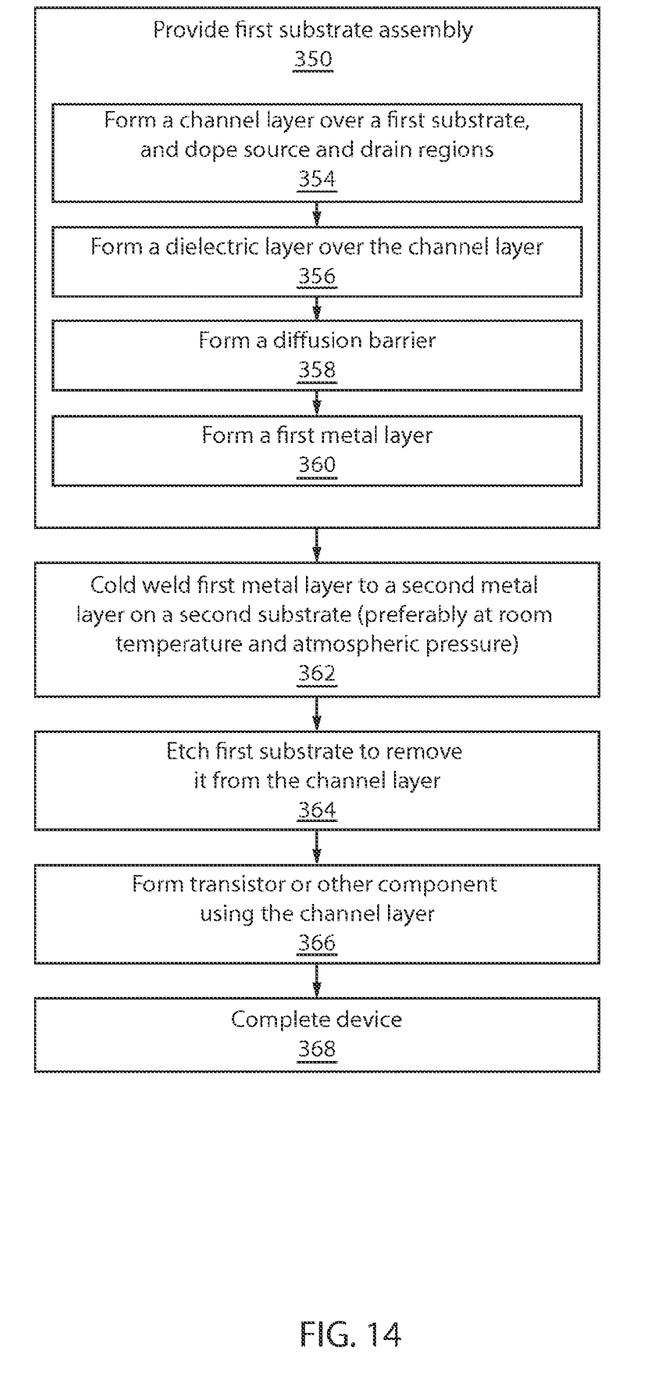
FIG. 14 is a block/flow diagram showing another method for cold welding and removing a substrate by employing an etch process in accordance with one illustrative embodiment.

It should be noted that, in some alternative implementations, the functions noted in the blocks may occur out of the order noted in FIGS. 13 and 14. For example, two blocks shown in succession may, in fact, be executed substantially concurrently, or the blocks may sometimes be executed in the reverse order, depending upon the functionality involved.

Referring to FIG. 13, a flowchart/block diagram for employing cold welding in semiconductor device fabrication is illustrative shown. In block 300, a first substrate assembly is formed. In one embodiment, in block 302, a sacrificial layer is formed over a first substrate. An optional protection layer may be provided between the first substrate and the sacrificial layer such that the sacrificial layer can be selectively etched relative to the protection layer.

In block 304, a channel layer is formed on the sacrificial layer. The channel layer may be masked and doped to form source and drain regions within the channel layer. In block 306, a dielectric layer is formed on the channel layer. In block 308, an optional diffusion barrier may be provided on the dielectric layer. The diffusion barrier may also be integrated in the dielectric layer. In block 310, a first metal layer is formed on the dielectric layer. The metal layer may be deposited by known processes including CVD, thermal evaporation, physical vapor depositing (PVD), such as sputtering, plating, etc.

In block 312, the first metal layer is cold-welded to a second metal layer formed on a second substrate. The second metal layer is preferably deposited on the second substrate in a same manner as the first metal layer. The first and second metal layers are brought into contact, and a steady pressure is applied to cause a bond or weld to form therebetween. The cold welding is preferably performed at about room temperature and about at atmospheric pressure for the ambient conditions. The cold weld pressure will depend on the material and the physical characteristics of the metal layers.

The cold welded metal layers may be employed as a ground plane to reduce short channel effects in the channel layer when operating as a transistor. Other applications may include using the metal layers as a heat sink or heat sink path, etc.

In block 314, the sacrificial layer is etched to expose the channel layer and remove the first substrate. This etch is selective to the layers surrounding the sacrificial layer. The first substrate may be reusable after it has been removed.

In block 316, a transistor device is formed using the channel layer. This may include lithographically patterning layers formed on the first substrate and depositing and planarizing a field oxide or other dielectric to act as an electrical isolation barrier with other devices. Source and drain contacts are also formed in contact with source and drain regions in the channel layer. In other embodiments, the lithographic patterning of the transistor layer stack may be performed before the cold weld is formed. A gate structure is also formed over the channel layer.

It should be understood that the second substrate may include other semiconductor devices (or other devices may be formed by continued processing). The transistor or component described here may be affixed locally to the larger substrate using the cold weld process. For example, the second substrate may include silicon, and silicon-based processing may be employed to form an array of components (e.g., transistors, capacitors, etc.). A metal layer formed on the silicon substrate may be employed as a landing site for a III-V transistor (e.g., a single device), which can be cold welded at the site as described. In block 318, processing continues to complete the device.

Referring to FIG. 14, a flowchart/block diagram for employing cold welding in semiconductor device fabrication in accordance with another embodiment is illustrative shown. In block 350, a first substrate assembly is formed. In one embodiment, in block 354, a channel layer is formed on a first substrate that may be lattice matched with the first substrate. The channel layer may be masked and doped to form source and drain regions within the channel layer. In block 356, a dielectric layer is formed on the channel layer. In block 358, an optional diffusion barrier may be provided on the dielectric layer. The diffusion barrier may also be integrated in the dielectric layer. In block 360, a first metal layer is formed on the dielectric layer. The metal layer may be deposited by known processes including CVD, thermal evaporation, physical vapor depositing (PVD), such as sputtering, plating, etc.

In block 362, the first metal layer is cold-welded to a second metal layer formed on a second substrate. The second metal layer is preferably deposited on the second substrate in a same manner as the first metal layer. The first and second metal layers are brought into contact, and a steady pressure is applied to cause a bond or weld to form therebetween. The cold welding is preferably performed at about room temperature and about at atmospheric pressure for the ambient conditions. The cold weld pressure will depend on the material and the physical characteristics of the metal layers.

The cold welded metal layers may be employed as a ground plane to reduce short channel effects in the channel layer when operating as a transistor. Other applications may include using the metal layers as a heat sink or heat sink path, etc.

In block 364, the first substrate is etched to expose the channel layer. This etch is preferably selective to the channel layer. In block 366, a transistor device is formed using the channel layer. This may include lithographically patterning layers formed on the first substrate and depositing and planarizing a field oxide or other dielectric to act as an electrical isolation barrier with other devices. Source and drain contacts are also formed in contact with source and drain regions in the channel layer. In other embodiments, the lithographic patterning of the transistor layer stack may be performed before the cold weld is formed. A gate structure is also formed over the channel layer.

It should be understood that the second substrate may include other semiconductor devices (or other devices may be formed by continued processing). The transistor or component described here may be affixed locally to the larger substrate using the cold weld process. For example, the second substrate may include silicon, and silicon-based processing may be employed to form an array of components (e.g., transistors, capacitors, etc.). A metal layer formed on the silicon substrate may be employed as a landing site for a III-V transistor (e.g., a single device), which can be cold welded at the site as described. In block 368, processing continues to complete the device.

Having described preferred embodiments of devices and methods for transistor formation using cold welding (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabrication of a semiconductor device, comprising:
    providing a first substrate assembly including a first substrate of a semiconductor material, a sacrificial layer present on a surface of the first substrate, a channel layer formed on the first sacrificial layer, and a first metal layer formed on the first sacrificial layer;
    providing a second substrate assembly including a second substrate of a semiconductor material and a second metal layer formed on the second substrate;
    joining the first metal layer to the second metal layer using a cold welding process; and
    removing an entirety of sacrificial layer by an etch process, wherein by removing the entirety of the sacrificial layer, the first substrate is separated from an assembly of the first metal layer and the second metal layer that has been joined and the second substrate that was not in contact with the sacrificial layer.

2. The method as recited in claim 1, wherein the joining of the first metal layer to the second metal layer includes cold welding the first and second substrate back-to-back to form a stack of semiconductor components.

3. The method as recited in claim 1, wherein at least one of the first metal layer and the second metal layer includes a textured three-dimensional surface.

4. The method as recited in claim 1, wherein at least one of the first substrate and the second substrate that is removed is reusable.

5. The method as recited in claim 1, wherein removing the sacrificial layer includes selectively etching the sacrificial layer.

6. The method as recited in claim 1, further comprising, after the joining step, removing at least one of the first substrate and the second substrate by etching.

7. The method as recited in claim 1, further comprising forming a dielectric layer between the channel layer and a first metal layer.

8. The method as recited in claim 1, further comprising forming a transistor employing the channel layer.

9. The method as recited in claim 1, further comprising employing the first metal layer joined to the second metal layer as a ground plane.

10. The method as recited in claim 1, wherein joining the first metal layer to the second metal layer using a cold welding process includes cold welding at room temperature and atmospheric pressure.

11. A method for fabrication of a semiconductor device, comprising:
    forming a sacrificial layer over a first substrate, the first substrate comprising a first semiconductor material;
    forming a channel layer on the sacrificial layer;
    forming a dielectric layer on the channel layer;
    forming a first metal layer on the dielectric layer;
    cold-welding the first metal layer to a second metal layer formed on a second substrate, the second substrate comprising a second semiconductor material;
    etching to remove an entirety of the sacrificial layer to expose the channel layer and separate the first substrate from an assembly including the channel layer, the dielectric layer, the first metal layer, the second metal layer, and the second substrate; and
    forming a transistor device using the channel layer.

12. The method as recited in claim 11, further comprising: providing a protection layer between the first substrate and the sacrificial layer such that the sacrificial layer is selectively etched relative to the protection layer.

13. The method as recited in claim 11, wherein forming a dielectric layer on the channel layer includes forming a diffusion barrier.

14. The method as recited in claim 11, wherein forming a channel layer includes doping portions of the channel layer to form source and drain regions.

15. The method as recited in claim 11, wherein the second substrate includes other semiconductor components formed by lithography.

16. The method as recited in claim 11, wherein the first substrate is reusable as removed.

17. The method as recited in claim 11, further comprising lithographically patterning layers formed on the first substrate.

18. The method as recited in claim 11, further comprising employing the first metal layer and the second metal layer as a ground plane.

19. The method as recited in claim 11, wherein cold welding includes cold welding at room temperature and atmospheric pressure.

20. A method for fabrication of a semiconductor device, comprising:

forming a channel layer over a first substrate, wherein the first substrate is comprised of a first semiconductor material and includes a sacrificial layer that is present on a surface of the first semiconductor material;

forming a dielectric layer on the channel layer;

forming a first metal layer on the dielectric layer;

cold-welding the first metal layer to a second metal layer formed on a second substrate, wherein the second substrate comprises a second semiconductor material;

etching to remove an entirety of the sacrificial layer, and to remove the first substrate from an assembly including the second substrate, second metal and first metal, and to expose the channel layer; and forming a transistor device using the channel layer.

21. The method as recited in claim 20, wherein forming a dielectric layer on the channel layer includes forming a diffusion barrier.

22. The method as recited in claim 20, wherein forming a channel layer includes doping portions of the channel layer to form source and drain regions.

23. The method as recited in claim 20, wherein the second substrate includes other semiconductor components formed by lithography.

24. The method as recited in claim 20, further comprising employing the first metal layer and the second metal layer as a ground plane.

* * * * *